(12) United States Patent
Bower, III et al.

(10) Patent No.: US 8,755,948 B2
(45) Date of Patent: Jun. 17, 2014

(54) CONTROLLING FLUID COOLANT FLOW IN COOLING SYSTEMS OF COMPUTING DEVICES

(75) Inventors: Fred A. Bower, III, Durham, NC (US);
Vinod Kamath, Raleigh, NC (US);
Michael S. Miller, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 255 days.

(21) Appl. No.: 12/945,958

(22) Filed: Nov. 15, 2010

(65) Prior Publication Data
US 2012/0123595 A1 May 17, 2012

(51) Int. Cl.
*G05D 23/00* (2006.01)
*G06F 1/00* (2006.01)

(52) U.S. Cl.
USPC .......................................... 700/300; 713/300

(58) Field of Classification Search
USPC ....................................................... 700/282
See application file for complete search history.

(56) References Cited

U.S. PATENT DOCUMENTS

| | | | |
|---|---|---|---|
| 5,852,563 A | 12/1998 | Weber et al. | |
| 6,308,776 B1 | 10/2001 | Sloan et al. | |
| 6,647,321 B2 | 11/2003 | Nagashima et al. | |
| 6,721,609 B1 * | 4/2004 | Wojsznis et al. | 700/28 |
| 6,854,514 B2 | 2/2005 | Sloan et al. | |
| 2001/0047864 A1 | 12/2001 | Sloan et al. | |
| 2004/0035194 A1 * | 2/2004 | Wakahara | 73/118.1 |
| 2005/0049729 A1 * | 3/2005 | Culbert et al. | 700/50 |
| 2005/0278070 A1 * | 12/2005 | Bash et al. | 700/276 |
| 2007/0032908 A1 * | 2/2007 | Hyland et al. | 700/275 |
| 2010/0032140 A1 | 2/2010 | Copeland et al. | |
| 2010/0032142 A1 | 2/2010 | Copeland et al. | |
| 2010/0101759 A1 * | 4/2010 | Campbell et al. | 165/80.4 |
| 2011/0132579 A1 * | 6/2011 | Best et al. | 165/104.31 |
| 2011/0232889 A1 * | 9/2011 | Eckberg et al. | 165/200 |
| 2012/0297807 A1 * | 11/2012 | Canney et al. | 62/228.4 |

OTHER PUBLICATIONS

HP Modular Cooling System Generation 2: water cooling technology, Jun. 2008, TC080603TB, Hewlett-Packard Development Company, L.P., U.S.
US 5,706,890, 01/1998, Sloan et al. (withdrawn)

\* cited by examiner

*Primary Examiner* — Sean Shechtman
(74) *Attorney, Agent, or Firm* — Olive Law Group, PLLC; Thomas E. Tyson

(57) ABSTRACT

Methods and systems for controlling fluid coolant flow in cooling systems of computing devices are disclosed. According to an aspect, a method may include determining a temperature of a fluid coolant in a cooling system of a computing device. For example, a temperature of water exiting a cooling system of a server may be determined. The method may also include determining an operational condition of the computing device. For example, a temperature of a processor, memory, or input/output (I/O) component may be determined. Further, the method may include controlling a flow of the fluid coolant through the cooling system based on the temperature of the fluid coolant and/or the operational condition.

21 Claims, 4 Drawing Sheets

CONTROLLING FLUID COOLANT FLOW IN COOLING SYSTEMS OF COMPUTING DEVICES

BACKGROUND

1. Field of the Invention

The present invention relates to cooling systems of computing devices, and more specifically, to systems and methods for controlling fluid coolant flow in cooling systems of computing devices.

2. Description of Related Art

A rack server, also referred to as a rack-mounted server, is a computer dedicated for use as a server and designed to be installed in a framework called a rack. The rack contains multiple mounting slots called bays, each designed to hold a hardware unit. A single rack may contain multiple servers stacked one above the other, consolidating network resources and minimizing required floor space. The rack server configuration also simplifies cabling among network components.

In a rack containing several servers, a special cooling system may be needed to prevent excessive heat buildup that would otherwise occur when many power-dissipating components are confined in a small space. Air is commonly used for cooling rack servers. Increasingly, water cooling is being used to deal with the special cooling requirements of rack servers in data centers, because data centers are often assigned the most convenient available space as opposed to a space that is adequately ventilated. Further, air in data centers is usually cooled using a refrigeration system that can consume as much as 30% of the data center power. For at least these reasons, it is desired to provide improved techniques for utilizing water for cooling rack servers while optimizing server performance.

BRIEF SUMMARY

One or more embodiments of the present invention provide methods and systems for controlling fluid coolant flow in cooling systems of computing devices. According to an aspect, a method may include determining a temperature of a fluid coolant in a cooling system of a computing device. For example, a server may use a temperature sensor to determine a temperature of water exiting a cooling system of the server. The method may also include determining an operational condition of the computing device. For example, a temperature of a processor, memory, or input/output (I/O) component of the server may be determined. Further, the method may include controlling a flow of the fluid coolant through the cooling system based on the temperature of the fluid coolant and/or the operational condition. For example, the server may control a valve for increasing or decreasing a flow of water through its cooling system based on the temperature of the water or an operational condition of the server.

DETAILED DESCRIPTION

Exemplary systems and methods for efficiently cooling servers using fluid coolant in accordance with embodiments of the present invention are described herein. Using the systems and methods described herein, water or other suitable fluid coolant can be efficiently utilized for cooling servers while maintaining the servers at optimal functional temperatures. In accordance with embodiments of the present invention, a fluid coolant flowing through the cooling system of each server in the rack may be controlled to achieve efficient use of the fluid coolant while maintaining the server and its components within their functional temperature limits. Further, the fluid coolant flow through the cooling system of each server may be controlled such that the temperature of the fluid coolant exiting the cooling system is maximized while the server and its components are maintained within their functional temperature limits. It will be recognized by those skilled in the art that the systems and methods described herein may also be similarly applied for cooling not only servers but also for cooling any suitable type of computing device.

In accordance with embodiments of the present invention, the techniques described herein may be applied to rack servers. Particularly, any rack server may individually apply the systems and methods described herein for efficiently using fluid coolant. In an example, water may be individually supplied to each server in a rack of servers. Each rack server may individually control the flow of water through its respective cooling system such that only the water needed for maintaining the server within its functional temperature limits is provided. Thereby, through use of the techniques described herein, high efficiency may be achieved because only the minimal water and power needed for pumping water through the server will be utilized.

Figure 1:
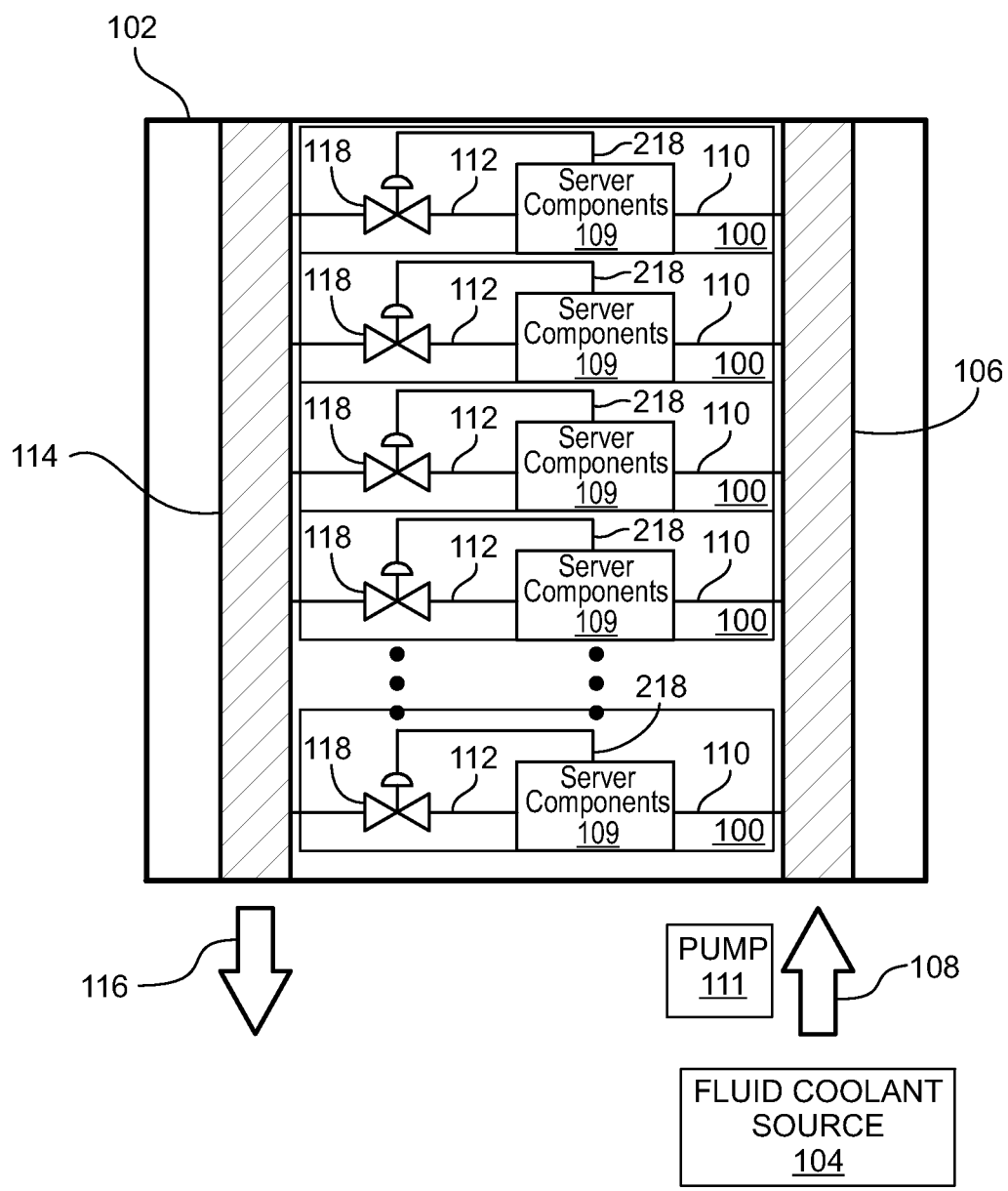
FIG. 1 is a diagram of a rack of servers each including a cooling system in accordance with embodiments of the present invention.

FIG. 1 sets forth a diagram of a rack of servers 100 each including a cooling system in accordance with embodiments of the present invention. Referring to FIG. 1, each of the servers 100 may be suitably mounted in bays attached to a rack framework 102. Water may be supplied from a fluid coolant source 104 positioned outside of the rack of servers 100 to a fluid input manifold 106 for distribution in parallel to each server 100. The source 104 may connected in fluid communication with the manifold 106 and may be configured to deliver the water into the manifold 106 in a direction indicated by arrow 108. The manifold 106 may be in fluid communication with a cooling system of each server 100. Each cooling system may be configured to route the water to locations in proximity to one or more components, generally designated as server components 109, of a respective server for absorbing waste heat. For example, the water may be directed to flow in proximity to server components 109, which may include, but are not limited to, a processor, memory, input/output (I/O) components, and the like. Cooling systems having high flow impedance may receive less water than those with low impedance. The servers 100 may emit differing amounts of thermal energy depending on work load, efficiency, and characteristics of the server components 109.

During their operation, server components 109 may produce excess thermal energy, the removal of which can improve their efficiencies. Input fluid lines 110 may fluidly connect each server cooling system to the manifold 106 for allowing the water to flow from the manifold 106 to the cooling systems. A pump 111 may be configured to move the water from the source 104, through the manifold 106 and input fluid lines 110, and to the cooling systems of the servers 100.

The cooling systems of the servers 100 may be fluidly connected to output fluid lines 112 for removal of the water from the cooling systems. The water exiting the cooling systems may be delivered by the fluid lines 112 to a fluid output manifold 114 for exiting the rack framework 102 in the direction indicated by arrow 116. Each output fluid line 112 may be connected to a valve 118 configured to control the flow of water through a respective cooling system. Particularly, each valve 118 may receive control communications from one or more server components 109 of a respective server 100 for adjusting a rate of the flow of water through a cooling system of the server. For example, a flow controller of a server 100 may generate and communicate to a respective valve 118 a signal including instructions for the valve to control a flow of the water through a respective cooling system. The valve 118 may be contained within its respective server 100 as shown in FIG. 1. Alternatively, the valve 118 may be located outside of its respective server 100.

The valve 118 may regulate the flow of water by opening, closing, or partially obstructing a passageway in a respective fluid line 112 based on the control signal from its respective server 100. When open or partially obstructing the passageway, the water flows from from the manifold 106, through a respective line 110, through a cooling system of a respective server 100, through the respective line 112, and into the manifold 114 due to water being at a higher pressure at manifold 106 than at the manifold 114. In this example, each valve 118 is an electromechanical valves configured to be controlled by electrical signals received from its respective server 100. Alternatively, the valves 118 may be any suitable type of valve configured to be controlled by electrical signals. The valves may each include an actuator, such an electromechanical actuator (e.g., an electric motor or solenoid).

Figure 2:
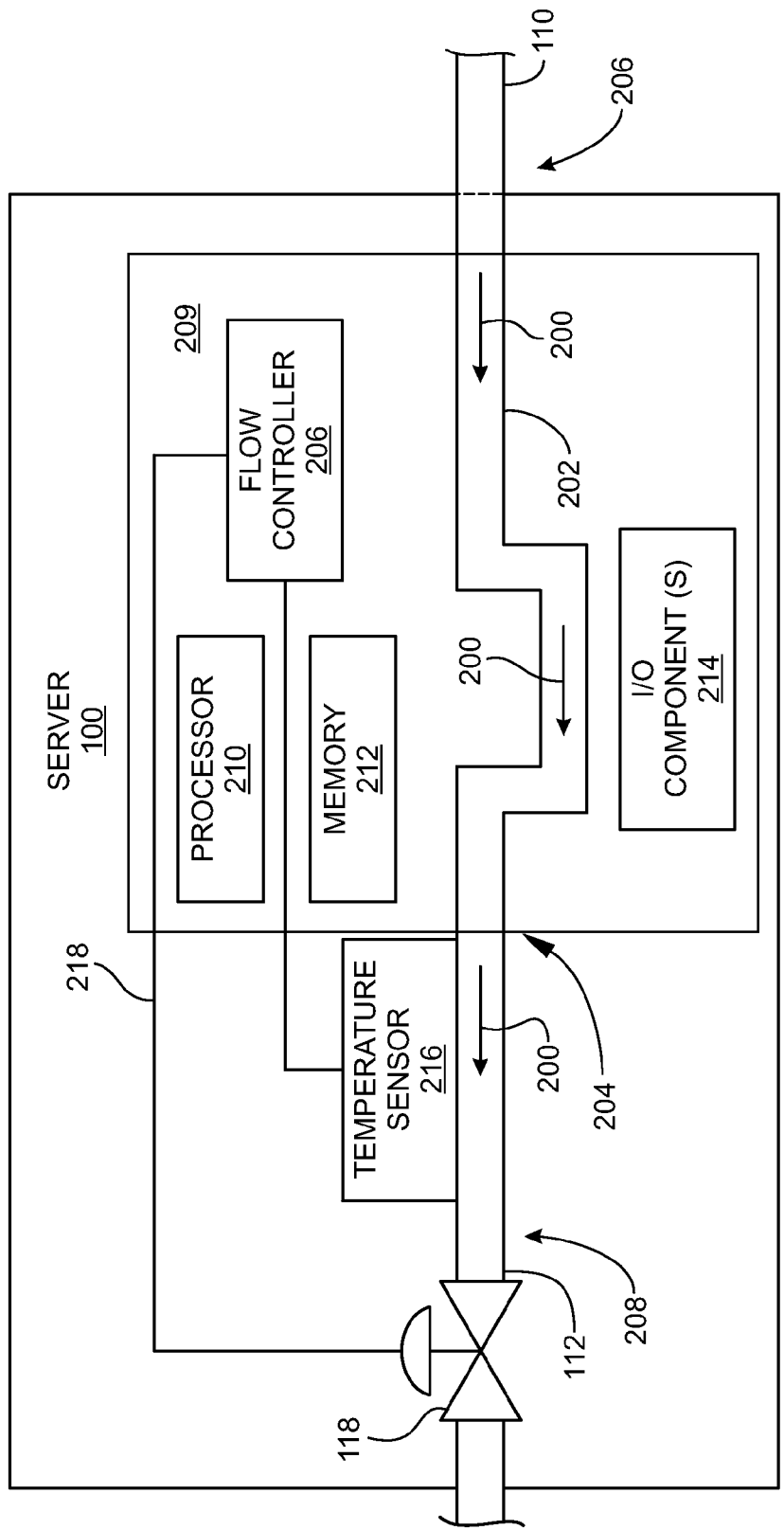
FIG. 2 is a block diagram of a server configured to control a flow of fluid coolant through its cooling system in accordance with embodiments of the present invention.

Control of the flow of water through a cooling system may be based on system parameters and/or environmental conditions. A server may be configured to use monitored system parameters and/or environmental conditions for determining input controls for a valve to control coolant fluid flow through its cooling system. For example, FIG. 2 illustrates a block diagram of a server 100 configured to control a flow of fluid coolant through its cooling system in accordance with embodiments of the present invention. In this example, the fluid coolant is water, although any other suitable coolant may be used. Referring to FIG. 2, the water may move in a direction indicated by arrows 200 through a coolant line 202 of a cooling system, generally designated 204. The water may enter the cooling system 204 generally at a location 206 where the coolant line 202 is connected to the input fluid line 110. The water may exit the cooling system 204 generally at a location 208 where the coolant line 202 fluidly connects to the output fluid line 112. The coolant line 202 is represented as a single line in FIG. 2; however, it should be appreciated that the coolant line may be one or more lines or other components configured to provide a fluid passageway for coolant between the input fluid line 110 and the output fluid line 112.

The server 100 may include a processor 210, memory 212, and one or more I/O components 214 for managing various components and for implementing processes of the server 100 as will be appreciated by those of skill in the art. The processor 210 and memory 212 may be part of a systems manager. The coolant line 202 may be routed within the server 100 to locations in proximity to the processor 210, memory 212, I/O components 214, and/or other components of the server 100 such that thermal energy may be transferred from these server components to the water contained within the coolant line 202 for cooling the server components. Accordingly, the water entering the server 100 at location 206 is cooler than the water exiting the server 100 at location 208 due to the transfer of thermal energy from the server components to the water. In this example, the water entering the server 100 is about 45° Celsius (C.), and the water exiting the server 100 is about 65° C., although the water entering and exiting the server may be any suitable temperature.

Figure 3:
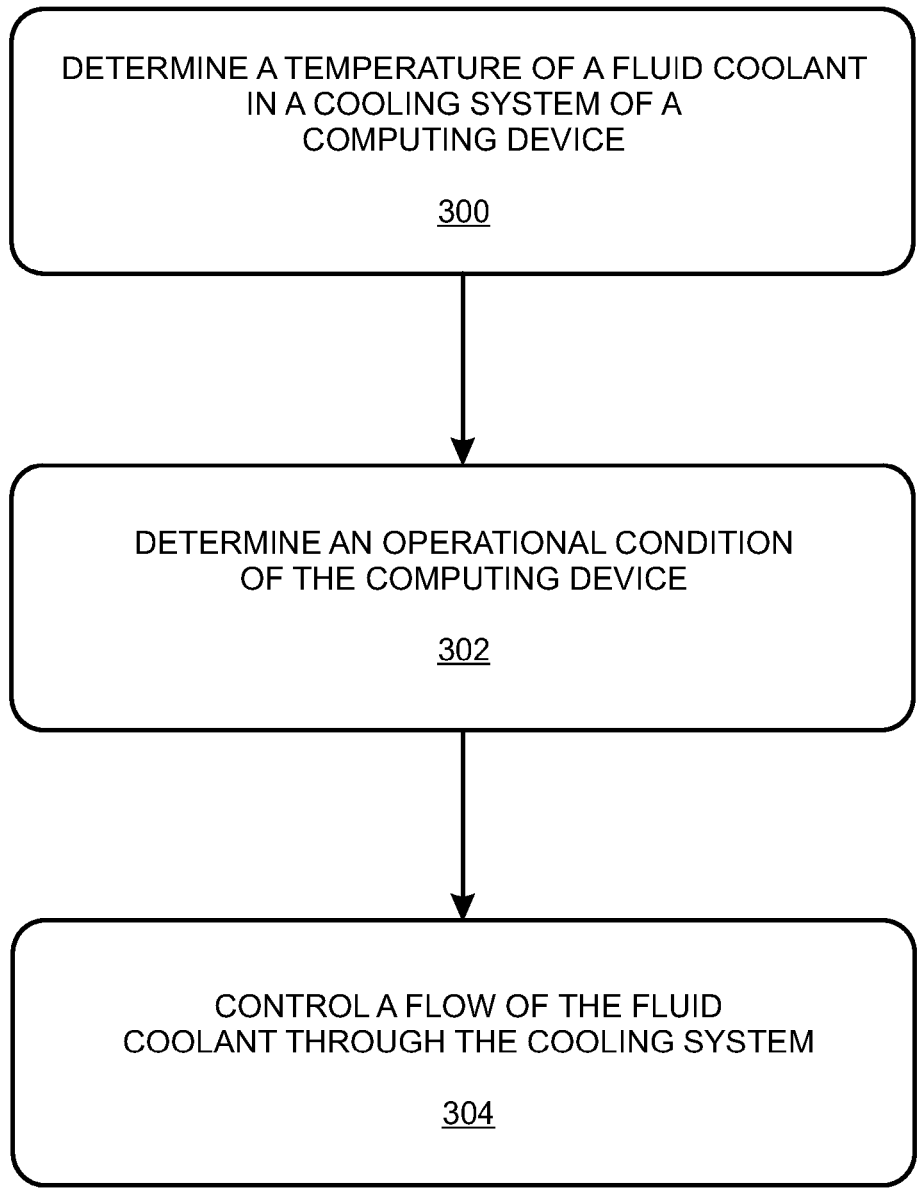
FIG. 3 is a flowchart of an exemplary method by which a flow controller may control the flow of water through a cooling system for cooling server of a server components according to embodiments of the present invention.

The server 100 may also include a flow controller 206 configured to control the flow of water through the coolant line 202 of the cooling system 204 for cooling server components. The flow controller 206 may include hardware, software, and/or firmware configured to control the water flow based on a temperature of the water in the cooling system 204 and/or an operational condition of the server 100. For example, FIG. 3 depicts a flowchart of an exemplary method by which the flow controller 206 may control the flow of water through the cooling system 204 for cooling server components according to embodiments of the present invention. In this exemplary method, reference is made to the server 100 shown in FIGS. 1 and 2 for purposes of illustration; however, reference to the server 100 should not be construed as limiting as the method may be applied for cooling components of any suitable computing device, such as a standalone computer.

Referring to FIG. 3, the method includes determining 300 a temperature of a coolant fluid in a cooling system of a computing device. For example, referring to FIG. 2, the server 100 may include a temperature sensor 216 suitably attached to the coolant line 202 or output fluid line 112 downstream from where thermal energy is transferred from one or more server components (e.g., the processor 210, memory 212, and I/O components 214). The temperature sensor 216 may be positioned at or near the location 208 where the water exits the cooling system 204. The flow controller 206 may be communicatively connected to the temperature sensor 216 for receiving signals including data indicating the temperature of the water at or near the location of the temperature sensor 216. The temperature data may be suitably stored in the memory 212.

The method of FIG. 3 includes determining 302 an operational condition of the computing device. For example, the server components (e.g., the processor 210, memory 212, and I/O components 214) may be suitably configured, such as with temperature sensors, to provide temperature data to the flow controller 206. Such temperature data may be stored in the memory 212. In another example, the processor 210 may provide one or both of a current work load mode and a planned work load mode to the flow controller 206. The work load mode information may indicate, for example, that the work load is high, or that the processor is in an idle or sleep state. The work load mode information may be stored in the memory 212.

The method of FIG. 3 includes controlling 304 a flow of the fluid coolant through the cooling system based on the temperature of the coolant and/or the operational condition. For example, the flow controller 206 may access the memory 212 to retrieve, from the memory 212, the temperature data of the water, the temperature data of server components, and/or the work load mode information. Using this data and information as set forth in more detail herein, the flow controller 206 may determine control signals for adjusting a respective valve 118 to control the flow of water through the cooling system 204. The flow controller 206 may generate the control signals and may communicate the control signals to the valve 118 via a suitable communication line 218. The valve 118 may receive the control signals and, in accordance with the control signals, open more, close more, or remain the same for increasing, decreasing, or maintaining, respectively, the flow rate of water through the coolant line 202. The greater the flow rate, the greater the transfer rate of thermal energy from the server components to the water. Conversely, the lower the flow rate, the lower the transfer rate of thermal energy from the server components to the water.

Figure 4:
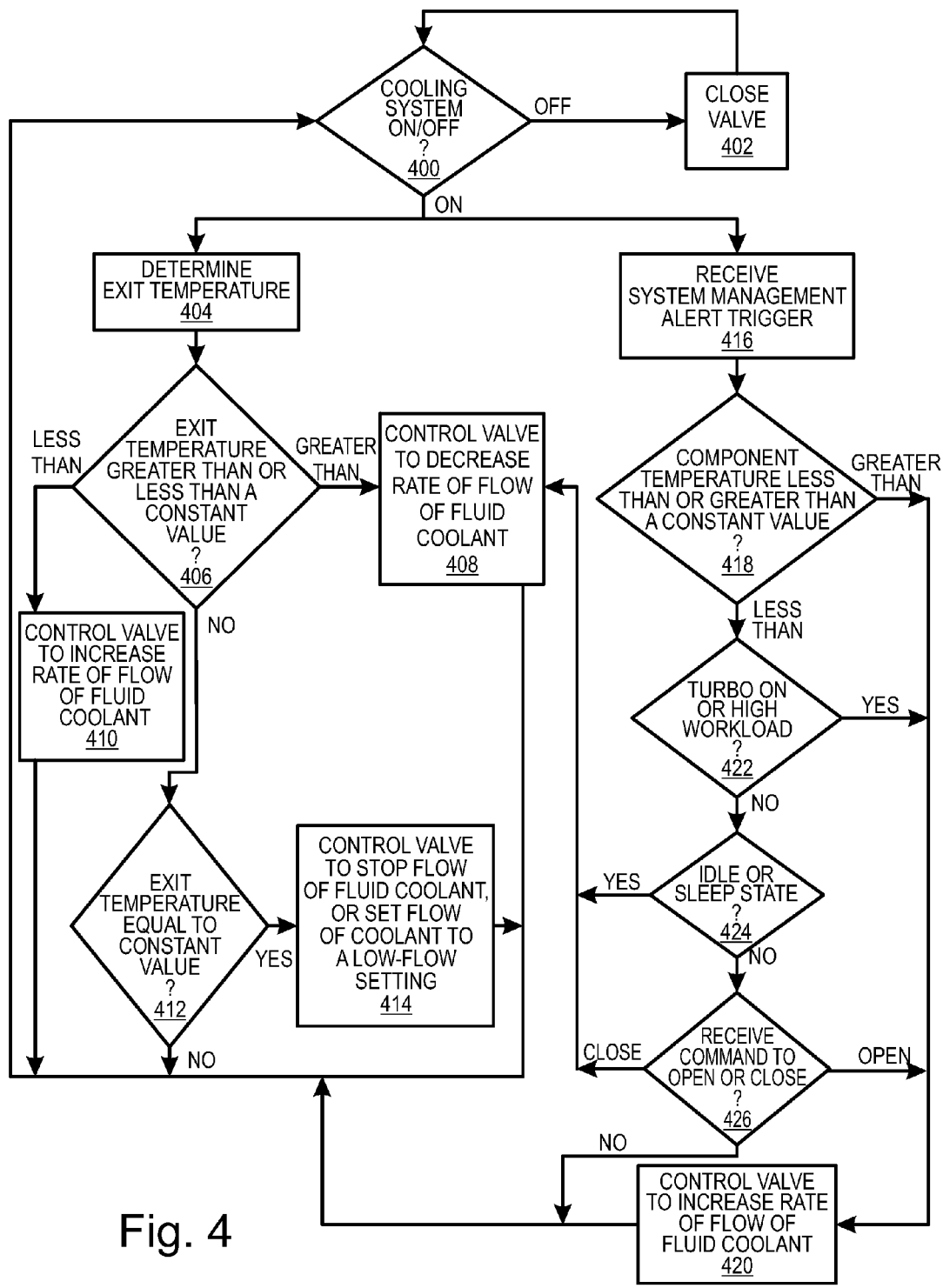
FIG. 4 is a flowchart of another exemplary method by which a flow controller may control the flow of water through a cooling system of a server for cooling server components according to embodiments of the present invention.

FIG. 4 depicts a flowchart of another exemplary method by which a flow controller may control the flow of water through a cooling system for cooling server components according to embodiments of the present invention. In this exemplary method, reference is made to the server 100 shown in FIGS. 1 and 2 for purposes of illustration; however, reference to the server 100 should not be construed as limiting as the method may be applied for cooling components of any suitable computing device, such as a standalone computer.

Referring to FIG. 4, the method includes turning 400 on or off the cooling system. If the cooling system is turned off, the method includes closing 402 a valve configured to control a flow of fluid coolant through the cooling system. For example, the flow controller 206 shown in FIG. 2 may be configured to determine that the cooling system 204 is turned off. The processor 210 or any other suitable component of the server 100 may communicate information to the flow controller 206 for indicating that the cooling system 204 is turned on or off. In response to determining that the cooling system 204 is turned off, the flow controller 206 may control the valve 118 to close the valve 118. After closing the valve, the method may return to step 400.

If the cooling system is turned on, the method includes determining 404 a temperature of fluid coolant at a location where the coolant exits the cooling system. For example, the temperature of the water flowing through the cooling system 204 may be measured at any location downstream from the server components cooled by the cooling system 204. In an example, the temperature sensor 216 may measure a temperature of the water and may communicate a signal indicating the temperature to the flow controller 206. The temperature may be measured at the water exit location 208, or downstream from the location 208 and upstream from the valve 118.

The method of FIG. 4 includes comparing the exit temperature of the fluid coolant to a constant value and determining 406 whether the temperature is greater than or less than the constant value. For example, the flow controller 206 may use the measured temperature indicated by the temperature sensor 216 for comparing the measured temperature to a predetermined temperature value. The flow controller 206 may access the memory 212 to retrieve the constant value and may determine whether the measured temperature is greater than or less than the constant value. A high efficiency water cooling system may be achieved when the water exiting the cooling system is at its highest while the server components are each operating below their functional temperature.

In response to determining that the exit temperature of fluid coolant is greater than the constant value, the method includes controlling 408 a valve to decrease a rate of flow of the fluid coolant through the cooling system. For example, the flow controller 206 may communicate a control signal to the valve 118 to close a predetermined number of increments for decreasing a rate of flow of water through the cooling system 204. After step 408, the method may return to step 400.

In response to determining that the exit temperature of fluid coolant is less than the constant value, the method includes controlling 410 the valve to increase a rate of flow of the fluid coolant through the cooling system. For example, the flow controller 206 may communicate a control signal to the valve 118 to open a predetermined number of increments for increasing a rate of flow of water through the cooling system 204. After step 408, the method may return to step 400.

In response to determining that the exit temperature of fluid coolant is neither less then nor greater than the constant value, the method includes determining 412 whether the exit temperature is equal to the constant value. In response to determining that the exit temperature is equal to the constant value, the method includes controlling 414 the valve to either stop the flow of fluid coolant through the cooling system, or set the flow of fluid coolant through the cooling system to a predetermined low-flow setting. The low-flow setting may be a valve setting in which the flow of fluid coolant through the valve is minimal. For example, the flow controller 206 may communicate a control signal to the valve 118 to stop the flow of water through the cooling system 204, or close to a minimal opening such that only a small flow of water can pass through the valve. After step 414, the method may return to step 400. Further, in response to determining that the exit temperature is not equal to the constant value, the method may return to step 400.

Referring again to step 400, in addition to proceeding to step 404 in response to determining that the cooling system is turned on, the method may include receiving 416 a system management alert trigger. The system management alert trigger may alert the flow controller 206 of system management alerts to which the flow controller 206 is subscribed. For example, the flow controller 206 may be alerted to a current work load mode or a planned work load mode of system component such as, for example, but not limited to, the processor 210. A system management processor of the server 100 may be aware of the state of various system components, and may notify the flow controller 206 of the states.

The method of FIG. 4 may include determining 418 whether one or more component temperatures are greater than or less than a constant value. The constant value may represent a maximum or near maximum functional temperature for the respective server component. The constant value for each component may be different or the same as others. In an example, a system component (e.g., the processor 210, memory 212, or I/O components 214) may be connected to a temperature sensor for detecting a temperature of the respective component and for communicating a signal indicating the temperature to the flow controller 206. The flow controller 206 may monitor the temperature of each component and may determine whether the temperature is greater than or less than a constant value. In response to determining that the temperature of one or more of the monitored components is greater than the respective constant values, the method includes controlling 420 the valve to increase a rate of flow of the fluid coolant through the cooling system. For example, the flow controller 206 may communicate a control signal to the valve 118 to open a predetermined number of increments for increasing a rate of flow of water through the cooling system 204. After step 420, the method may return to step 400.

At step 418, in response to determining 422 that the temperature of each monitored component is less than the respective constant values, the method may include determining whether a processor is in a mode with turbo on, or in a state with a high current or planned work load. A turbo mode of a processor is a mode in which the processor is overclocked, and the turbo mode can be initiated on the fly when increased processing performance is needed. For example, the processor 210 may notify the flow controller 206 of such modes or states. In an example, the work load may be known based on events, such as power failure to the server. In response to determining that the processor is in a mode with turbo on, or in a state with a high current or planned work load, the method includes proceeding to step 420. In response to determining that the processor is not in a mode with turbo on and not in a state with a high current or planned work load, the method includes proceeding to step 424. In this way, water usage may be adjusted based on a planned or current work load of a server component.

At step 424, the method includes determining whether a processor is in an idle or sleep state. For example, the processor 210 may notify the flow controller 206 of its state, particularly, whether the processor 210 is in an idle or sleep state. The flow controller 206 may monitor the state of the processor 210. In response to determining that the processor is in an idle or sleep state, the method may proceed to step 408 for decreasing the rate of flow of fluid coolant. In response to determining that the processor is not in an idle or sleep state, the method may proceed to step 426.

At step 426, the method includes determining whether a user command has been received for opening or closing the valve. For example, a user may use a suitable user interface of the server 100 for inputting a command to increase or decrease the rate of flow of the fluid coolant. The command may be communicated to the flow controller 206. In response to receiving a command to open the valve, the method may proceed to step 420 for controlling the valve to increase the rate of flow of fluid coolant. Alternatively, in response to receiving a command to close the valve, the process may proceed to step 408 for controlling the valve to decrease the rate of flow of fluid coolant. In response to determining that no user command has been received, the process may proceed to step 400. The user may enter such commands, for example, for testing purposes such as, but not limited to, determining an optimal fluid coolant exit temperature that balances energy efficiency and system component temperatures.

In accordance with embodiments of the present invention, an environmental condition to which a server is exposed may be detected and the resultant data used for controlling flow of fluid coolant through a cooling system of the server. For example, referring to FIG. 2, a temperature of air surrounding the server 100 may be detected by a suitable temperature sensor. The temperature sensor may communicate a signal to the flow controller 206 that indicates a temperature of the air surrounding the server 100. Based on the temperature of the air surrounding the server 100, the flow controller may open the valve 118 or close the valve 118 a predetermined number of increments to increase or described, respectively, the rate of flow of water through the cooling system 204. For example, in response to determining that the air temperature is greater than a predetermined value, the valve 118 may be controlled to open the valve the predetermined number of increments. Conversely, in response to determining that the air temperature is less than a predetermined value, the valve 118 may be controlled to close the valve the predetermined number of increments. In this way, embodiments of the present invention may anticipate the effects of environmental conditions on system operations, and may accordingly adjust fluid coolant flow for cooling system components.

In accordance with embodiments of the present invention, the flow rate of fluid coolant through a server cooling system may be adjusted for optimizing system performance. For example, a flow controller may control a valve to increase the flow rate of water through a server cooling system for causing a server component to exit a throttled state.

In accordance with embodiments of the present invention, the flow rate of fluid coolant through a server cooling system may be adjusted based on measurements of leakage current of server processors or other server components. Leakage current may be relative to a temperature of a server component. When high amounts of leakage current is detected, a flow controller may control a valve to increase the flow rate of water through a server cooling system for minimizing the leakage current.

As mentioned above, efficient use of fluid coolant can be maintained when the temperature of the fluid coolant exiting a server cooling system is at a maximum or near maximum while system components are within their functional temperatures. Water exiting a server cooling system at such high temperatures may be used, for example, for heating buildings and for other suitable uses of hot water.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium (including, but not limited to, non-transitory computer readable storage media). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, radio frequency (RF), etc., or any suitable combination of the foregoing.

Computer program code for carrying out operations for aspects of the present invention may be written in any combination of one or more programming languages, including an object oriented programming language such as JAVA, SMALLTALK, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter situation scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or diagrams of methods, apparatus (systems) and computer program products according to embodiments of the invention. For example, aspects of the present invention are described with reference to the diagrams of FIGS. 1 and 2 and the flowcharts of FIGS. 3 and 4. It will be understood that each block of the flowchart illustrations and/or diagrams, and combinations of blocks in the flowchart illustrations and/or diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
at a server rack comprising a plurality rack servers, each of the rack servers comprising a plurality of components and a cooling system, wherein each cooling system is configured to control a flow of fluid coolant through the respective rack server independent from the cooling systems of each of the other rack servers, and each cooling system being configured for:
determining whether a temperature of each of the plurality of components of the respective rack server is less than a predetermined threshold value;
in response to determining that the temperature of each of the plurality of components of the respective rack server is less than the predetermined threshold value:
determining whether one of a current work load mode and a planned work load mode for a processor of the respective rack server is one of an overclocking mode and a predetermined workload mode;
in response to determining that the one of a current work load mode and a planned work load mode for a processor of the respective rack server is the one of an overclocking mode and predetermined work load mode, increasing a flow of the fluid coolant through the cooling system of the respective rack server;
determining whether a state of the respective rack server is one of an idle state and a sleep state;
in response to determining that the state of the respective rack server is one of an idle state and a sleep state, decreasing a flow of the fluid coolant through the cooling system of the respective rack server;

determining whether a command received by the respective rack server is one of an open command and a close command;

in response to determining that the command received by the respective rack server is an open command, increasing the flow of the fluid coolant through the cooling system of the respective rack server; and in response to determining that the command received by the respective rack server is a close command, decreasing the flow of the fluid coolant through the cooling system of the respective rack server.

2. The method of claim 1, wherein the fluid coolant comprises water.

3. The method of claim 1, comprising determining the temperature of the fluid coolant at a location where the fluid coolant exits the cooling system of the respective rack server.

4. The method of claim 3, comprising comparing the temperature of the fluid coolant to a constant value, and wherein controlling a flow of the fluid coolant comprises controlling the flow of the fluid coolant based on the comparison of the temperature of the fluid coolant to the constant value.

5. The method of claim 4, wherein comparing the temperature of the fluid coolant to a constant value comprises determining whether the temperature of the fluid coolant is greater than, less than, or equal to the constant value, wherein controlling the flow of the fluid coolant comprises:

in response to determining that the temperature of the fluid coolant is greater than the constant value, controlling a valve to decrease a rate of the flow of the fluid coolant through the cooling system;

in response to determining that the temperature of the fluid coolant is less than the constant value, controlling the valve to increase a rate of the flow of the fluid coolant through the cooling system; and in response to determining that the temperature of the fluid coolant is equal to the constant value, one of controlling the valve to stop the flow of fluid coolant through the cooling system and setting the flow of the fluid coolant through the cooling system to a predetermined low-flow setting.

6. The method of claim 1, wherein the each of the components include at least one of a processor, memory, and input/output (I/O) component, and wherein controlling a flow of the fluid coolant comprises controlling the flow of the fluid coolant based on the temperature of the at least one of the processor, memory, and I/O component.

7. The method of claim 6, comprising determining whether the temperature of the at least one of the processor, memory, and I/O component is greater than or less than a constant value, and wherein the method comprises:

in response to determining that the temperature of the at least one of the processor, memory, and I/O component is greater than the constant value, controlling a valve to increase a rate of the flow of the fluid coolant through the cooling system; and in response to determining that the temperature of the at least one of the processor, memory, and I/O component is less than the constant value, controlling the valve to decrease a rate of the flow of the fluid coolant through the cooling system.

8. The method of claim 1, wherein controlling a flow of fluid coolant comprises controlling a valve to adjust the flow of fluid coolant through the cooling system.

9. The method of claim 1, comprising:

determining an environmental condition to which the computing device is exposed, and wherein controlling flow of the fluid coolant comprises controlling the flow of fluid coolant based on the determined environmental condition.

10. The method of claim 9, wherein the environmental condition comprises temperature of air surrounding the respective rack server.

11. A system comprising:

a server rack comprising a plurality rack servers, each of the rack servers comprising a plurality of components and a cooling system, system is configured to control a flow of fluid coolant through the respective rack server independent from the cooling systems of each of the other rack servers, and each cooling system comprising:

a plurality of temperature sensors configured to detect a temperature of each of a plurality of components of the respective rack server; and a flow controller configured to:

determine whether a temperature of each of the plurality of components of the respective rack server is less than a predetermined threshold value;

determine whether one of a current work load mode and a planned work load mode for a processor of the respective rack server is one of an overclocking mode and a predetermined workload mode in response to determining that the temperature of each of the plurality of components is less than the predetermined threshold value;

increase a flow of the fluid coolant through the cooling system of the respective rack server in response to determining that the one of a current work load mode and a planned work load mode for a processor of the respective rack server is the one of the overclocking mode and the predetermined work load mode;

determine whether a state of the respective rack server is one of an idle state and a sleep state;

decrease a flow of the fluid coolant through the cooling system of the respective rack server in response to determining that the state of the respective rack server is one of an idle state and a sleep state;

determine whether a command received by the respective rack server is one of an open command and a close command;

increase the flow of the fluid coolant through the cooling system of the respective rack server in response to determining that the command received by the respective rack server is an open command; and decrease the flow of the fluid coolant through the cooling system of the respective rack server in response to determining that the command received by the respective rack server is a close command.

12. The system of claim 11, wherein the fluid coolant comprises water.

13. The system of claim 11, further comprising another temperature sensor positioned in proximity to where the fluid coolant exits the cooling system of the respective rack server, and wherein the flow controller is configured to control the flow of the fluid coolant based on the temperature of the fluid coolant exiting the cooling system.

14. The system of claim 13, wherein the flow controller is configured to:

compare the temperature of the fluid coolant to a constant value, and control the flow of the fluid coolant based on the comparison of the temperature of the fluid coolant to the constant value.

15. The system of claim 14, wherein the flow controller is configured to:
determine whether the temperature of the fluid coolant is greater than, less than, or equal to the constant value;
control a valve to decrease a rate of the flow of the fluid coolant through the cooling system in response to determining that the temperature of the fluid coolant is greater than the constant value;
control the valve to increase a rate of the flow of the fluid coolant through the cooling system in response to determining that the temperature of the fluid coolant is less than the constant value; and
control the valve to stop the flow of fluid coolant through the cooling system and set the flow of the fluid coolant through the cooling system to a predetermined low-flow setting in response to determining that the temperature of the fluid coolant is equal to the constant value.

16. The system of claim 11, wherein the components include at least one of a processor, memory, and input/output (I/O) component, and
wherein the flow controller is configured to:
determine a temperature of the at least one of a processor, memory, and input/output (I/O) component; and
control the flow of the fluid coolant based on the temperature of the at least one of the processor, memory, and I/O component.

17. The system of claim 16, wherein the flow controller is configured to:
determine whether the temperature of the at least one of the processor, memory, and I/O component is greater than or less than a constant value;
control a valve to increase a rate of the flow of the fluid coolant through the cooling system in response to determining that the temperature of the at least one of the processor, memory, and I/O component is greater than the constant value; and
control the valve to decrease a rate of the flow of the fluid coolant through the cooling system in response to determining that the temperature of the at least one of the processor, memory, and I/O component is less than the constant value.

18. The system of claim 11, wherein the flow controller is configured to control a valve to adjust the flow of fluid coolant through the cooling system.

19. The system of claim 11, wherein the flow controller is configured to:
determine an environmental condition to which the respective rack server is exposed; and
control the flow of fluid coolant based on the determined environmental condition.

20. The system of claim 19, wherein the environmental condition comprises temperature of air surrounding the respective rack server.

21. A computer program product for controlling fluid coolant flow in a cooling system of a rack server of a plurality rack servers in a server rack, the rack server comprising a plurality of components and a cooling system, wherein the cooling system is configured to control a flow of fluid coolant through the rack server independent from the cooling systems of each of the other plurality of rack servers in the server rack, the computer program product comprising:
a computer readable non-transitory storage medium having computer readable program code embodied therewith, the computer readable program code comprising:
computer readable program code configured to determine whether a temperature of each of the plurality of components of the rack server is less than a predetermined threshold value;
computer readable program code configured to determine whether one of a current work load mode and a planned work load mode for a processor of the rack server is one of a overclocking mode and predetermined workload mode in response to determining that the temperature of each of the plurality of components is less than the predetermined threshold value;
computer readable program code configured to increase a flow of the fluid coolant through the cooling system in response to determining that the one of a current work load mode and a planned work load mode for a processor of the rack server is the one of the overclocking mode and predetermined work load mode;
computer readable program code configured to determine whether a state of the respective rack server is one of an idle state and a sleep state;
computer readable program code configured to decrease a flow of the fluid coolant through the cooling system of the respective rack server in response to determining that the state of the respective rack server is one of an idle state and a sleep state;
computer readable program code configured to determine whether a command received by the respective rack server is one of an open command and a close command;
computer readable program code configured to increase the flow of the fluid coolant through the cooling system of the respective rack server in response to determining that the command received by the respective rack server is an open command; and
computer readable program code configured to decrease the flow of the fluid coolant through the cooling system of the respective rack server in response to determining that the command received by the respective rack server is a close command.

* * * * *